United States Patent
Erwin et al.

(10) Patent No.: US 8,686,749 B2
(45) Date of Patent: Apr. 1, 2014

(54) THERMAL INTERFACE MATERIAL, TEST STRUCTURE AND METHOD OF USE

(75) Inventors: Brian M. Erwin, Hopewell Junction, NY (US); David L. Gardell, Essex Junction, VT (US); James N. Humenik, Hopewell Junction, NY (US); Rajneesh Kumar, Hopewell Junction, NY (US); John Lawson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 794 days.

(21) Appl. No.: 12/770,948

(22) Filed: Apr. 30, 2010

(65) Prior Publication Data

US 2011/0267084 A1    Nov. 3, 2011

(51) Int. Cl.
*G01R 31/02* (2006.01)

(52) U.S. Cl.
USPC .............................. 324/762.01; 324/763.01

(58) Field of Classification Search
USPC ....................................................... 324/760
See application file for complete search history.

(56) References Cited

U.S. PATENT DOCUMENTS

| | | | |
|---|---|---|---|
| 5,088,006 A | | 2/1992 | del Puerto et al. |
| 5,224,356 A | * | 7/1993 | Colvin et al. ................. 62/259.2 |
| 5,918,665 A | | 7/1999 | Babcock et al. |
| 6,797,382 B2 | * | 9/2004 | Nguyen et al. ............. 428/411.1 |
| 7,141,448 B2 | * | 11/2006 | Ramalingam et al. .......... 438/64 |
| 7,259,580 B2 | | 8/2007 | Aube et al. |
| 7,651,340 B2 | * | 1/2010 | Barabi et al. ..................... 439/73 |
| 2004/0191501 A1 | * | 9/2004 | Rasiah .......................... 428/325 |
| 2006/0090881 A1 | | 5/2006 | Tuma |
| 2007/0051773 A1 | * | 3/2007 | Ruchert et al. ................. 228/101 |
| 2007/0161521 A1 | | 7/2007 | Sachdev et al. |
| 2007/0290378 A1 | * | 12/2007 | Coffin et al. .................. 257/791 |
| 2008/0298016 A1 | | 12/2008 | Karidis et al. |
| 2009/0281254 A1 | | 11/2009 | Bertrand et al. |
| 2010/0006255 A1 | | 1/2010 | Bilodeau |

OTHER PUBLICATIONS

Epoxies 50-1225 Technical Bulletin, Thermally Conductive Silicone Rubber, Jun. 2003, p. 1-2.*
ChemSpider, the free cheical database, ID 11885, Pentadecane, p. 1-3.*
Si,gma, Product Information, Hexadecane Product No. H0255, Apr. 2003, p. 1.*
Waldstein, Analysis of pump oil and alkanes evaporation, U of S. Floriday, Masters Thesis, 2008, p. 1-89.*
Stiver, Warren, Evaporation times and rates of specific hydrocarbons in oil spills, Environ. Sci. and Tech., 1989, 23, 101-105.*
DeHaven, Keith, et al., Controlled collapse chip connection (C4)—an enabling technology, Proc. $44^{th}$ Elec. Compon. & Tech. Conf., 1994, May 1-4, 1994, p. 1.*
A.A. Mills et al., "Rate of evaporation of hydrocarbons from a hot surface: Nukiyama and Leidenfrost temperatures," Eur. J. Phys. vol. 3., 1982, pp. 152-154.

* cited by examiner

*Primary Examiner* — Thomas F Valone
(74) *Attorney, Agent, or Firm* — Steven Meyers; Roberts Mlotkowski Safran & Cole, P.C.

(57) ABSTRACT

Non-corrosive thermal interface materials for use in a test structure and method of use. The test structure includes a heat sink for dissipating heat away from a device under test. The test structure further includes a non-corrosive thermal interface material disposed between the heat sink and the device under test. The non-corrosive thermal interface material is capable of withstanding test conditions for at least 60 minutes for at least 115° C. without staining or leaving residue on the device under test after baking.

24 Claims, 10 Drawing Sheets

15a

15b

Control

Pentadecane

THERMAL INTERFACE MATERIAL, TEST STRUCTURE AND METHOD OF USE

FIELD OF THE INVENTION

The invention relates to thermal interface materials for use with a test structure and method of use and, more particularly, to non-corrosive thermal interface materials for use in a test structure and method of use, e.g., module test and burn in.

BACKGROUND

The high cost associated with manufacturing integrated circuits dictates that defective devices be diagnosed as early as possible in the manufacturing process. For this reason, it is highly advantageous to test integrated circuit devices at the wafer level before further processing and packaging. For testing, the wafers are clamped to a wafer chuck and brought into contact with highly sophisticated probes. Once probe contact is made, the circuits are tested for both functionality and power integrity. However, circuits can be tested at power levels in excess of 400 watts, which consequently generates a tremendous amount of heat build-up in the chips which is removed by the massive wafer chuck.

After wafer test, the wafers are diced into individual devices also known as chips. The good devices are mounted onto substrates to create modules. The modules then go through additional testing that may include burn in and re test.

During module test (e.g., circuit test) there is a need to accurately control temperature of high power devices. Thus the test equipment typically includes a high performance heat sink, test socket and tester electronics. The module is installed in the socket, the heat sink is brought into contact with the chip, the chip is tested, the heat sink is removed and the module is removed from the socket and sorted based on functionality.

In some applications, a mixture of water and other additives (i.e., Propylene Glycol (PG)) is placed between the chip and heat sink as a Liquid Thermal Interface (LTI) in order to improve thermal contact. Water based LTI has excellent thermal performance but has proven to be unfavorable for other reasons. For example, at high test temperatures some of the water may evaporate before the end of test. Thus, in order to ensure that water remains at the interface, special test fixtures need to be designed (i.e., new tooling and set up) in order to replenish the water during test. Otherwise, it would be necessary to disassemble the test fixture, during test, to replenish the water. In either case, costs and time are added to the test.

Also, water and other substances such as, for example, PG, is known to corrode the C4 connects. For example, the liquid can occasionally get on unprotected surfaces of the chip or carrier and result in corrosion, made worse by the voltages present. Other solutions include, permanently under fill or otherwise protect the C4s and sensitive surfaces from contact with water during the testing. However, this is undesirable because it limits the ability to salvage substrates from defective chips or to remove the good chips for sale as known good die.

Alternate interface materials have shown to each have some disadvantage. Helium is clean and non corrosive but thermal performance is insufficient. PAO (Poly Alpha Olefin) oil and various types of thermal grease have thermal performance almost as good as water but require cleaning with a solvent after test. Thermal pads have insufficient thermal performance and often leave a residue. Fluorinated fluids may be non-corrosive and clean but have poor thermal performance due to their low thermal conductivity. Liquid metals and soft metals can have very good thermal performance but can oxidize (degrade) over time and repeated reuse, they can damage the heat sinks and can have unreliable thermal contact to the chip. Greases, phase change materials and adhesives can make it difficult to separate the heat sink from the chip after test and leave a residue.

Accordingly, there exists a need in the art to overcome the deficiencies and limitations described hereinabove.

SUMMARY

In a first aspect of the invention, a test structure comprises a heat sink for dissipating heat away from a device under test. The test structure further comprises a non-corrosive thermal interface material disposed between the heat sink and the device under test. The non-corrosive thermal interface material is capable of withstanding test conditions for at least 60 minutes for at least 115° C. without staining or leaving residue on the device under test after baking.

In another aspect of the invention, a structure of testing a device comprises a substrate or card for attaching to a device under test. The structure further comprises a heat sink structured to dissipate heat away from the device under test. The structure further comprises a thermal interface material disposed between the heat sink and the device under test. The thermal interface material is non-corrosive to C4 components on the device under test, non-evaporative for temperatures of at least 115° C. for about an hour, and residual free after testing is complete.

In yet another aspect of the invention, a test structure comprises a heat sink for dissipating heat away from a device under test, and a non-corrosive thermal interface material disposed between the heat sink and the device under test. The non-corrosive thermal interface material is one or more alkane with 12 to 16 carbon atoms.

In yet another aspect of the invention, a method of testing a structure comprises providing a controlled weight and volume of thermal interface material to a device under test and heat sink. The thermal interface material is non-corrosive to C4 interconnects, is non-evaporative during testing and is residual free. The method further comprises testing the device under a predetermined load, time and temperature, separating the device and heat sink, and heating the device to evaporate the thermal interface material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1A:
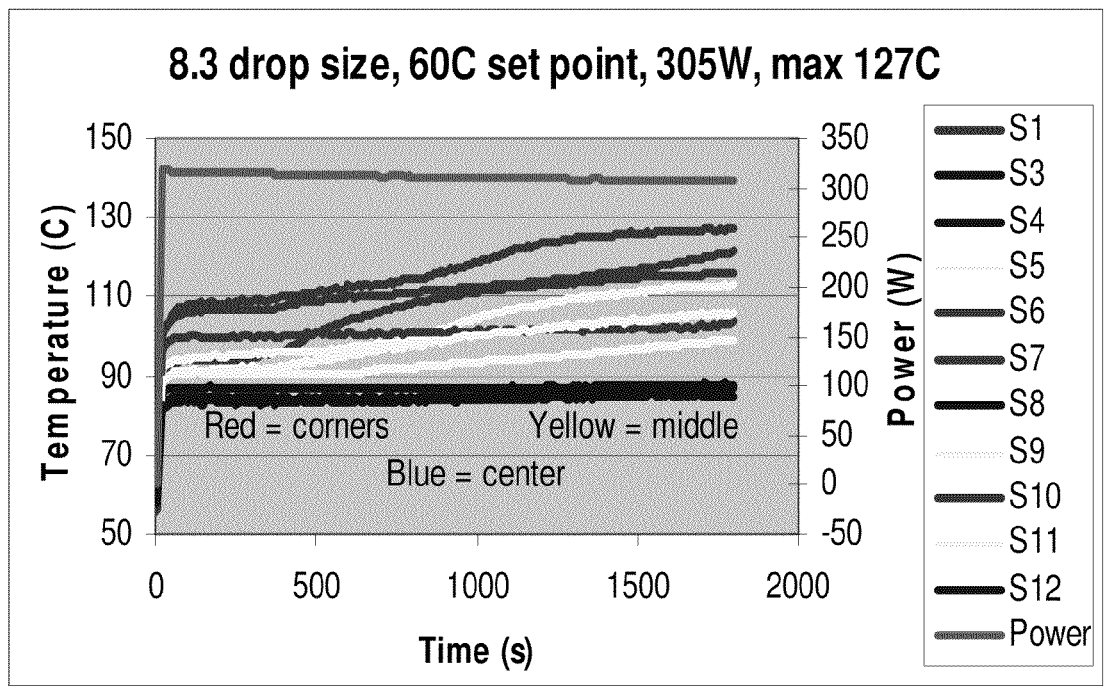
FIG. 1a shows a performance graph of a known thermal interface material.

The invention relates to thermal interface materials for use with a test structure and method of use and, more particularly, to non-corrosive thermal interface materials for use in a test structure and method of use, e.g., module test and burn in. In embodiments, the thermal interface material is non-corrosive to the device under test and, more specifically, does not corrode at least the C4 (controlled collapse chip connection) structures of the device. In embodiments, the thermal interface material is electrically insulating and is capable of withstanding test conditions for a certain time and temperature during the test of the device. Illustratively, in one example, the thermal interface material can withstand conditions (e.g., not evaporate) during test from about 5 to 50 minutes at about 55° C. to about 115° C., and more specifically at least 60 minutes for at least 115° C. Accordingly, it has been found that the thermal interface material of the present invention does not evaporate during test, thereby eliminating the need to at least (i) disassemble the test structure to replenish the thermal interface material, or (ii) provide an elaborate replenishment system for the test structure, both of which increase test time and costs.

Advantageously, the thermal interface materials of the present invention provide improved thermal performance during test, which hence ensures that the device will not be destroyed or have its performance impaired by test procedures. In additional embodiments, the thermal interface material of the present invention does not leave a residue on the device, and thus does not need to be removed by solvents which, in turn, may corrode or damage the device or module. As should be understood by those of skill in the art, residue is detrimental to post test processing. In additional embodiments, the thermal interface material of the present invention is environmentally safe, non-toxic, and non-hazardous, and is compatible with other module (test) components (e.g., flux, underfill, capacitors, TIM, etc.) and tooling components (e.g., nozzle, syringe, piston, O-ring, connector, tubing, bottle, etc.). The thermal interface material allows for easy separation of the heat sink from the chip at the end of test.

In embodiments, the thermal interface material is an organic thermal interface material that is devoid of fluorine, chlorine, oxygen and nitrogen. The thermal interface material can be an organic thermal interface material that is devoid of oxygen. In more specific embodiments, the thermal interface material is a hydrocarbon that is devoid of oxygen. In additional specific embodiments, the thermal interface material is a hydrocarbon that is devoid of fluorine, chlorine, oxygen and nitrogen. In more specific embodiments, the thermal interface material can be a hydrocarbon that has a boiling point, in atmosphere, of between about 220° C. to about 300° C. The hydrocarbon is organic with 12 to 16 carbon atoms and more specifically one or more alkane with 12 to 16 carbon atoms. In still further specific embodiments, normal alkane composed of 12 to 16 carbon atoms and more specifically can be a normal alkane composed of 14 to 16 carbon atoms. In even more specific embodiments, the alkane can be Pentadecane or Hexadecane.

Figure 1B:
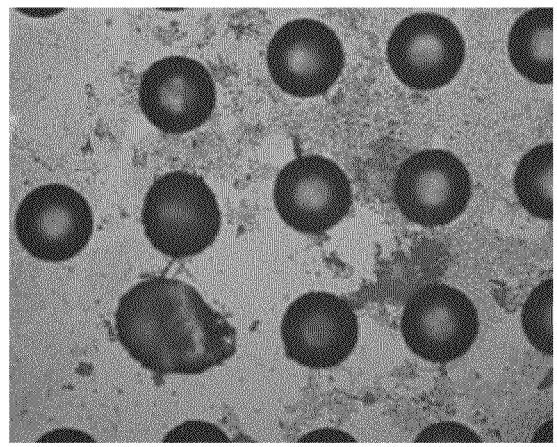
FIG. 1b shows a device with corrosion residual on its surface.

FIG. 1a shows results of a known thermal interface material mixture of water and propylene glycol tested between a 19 mm×20 mm chip and a liquid cooled heat sink with a cooling fluid temperature of 60° C. Heat sink force was 44 lb. At time=0, the power is off and the device is at the cooling fluid temperature, and when the power is turned on the chip heats up. In this test, there are 11 temperature sensors across the chip. As shown, the temperatures are steady up to about 300 seconds when some of the corner sensors start increasing in temperature. This increase in temperature is due to fluid evaporation from between the chip and heat sink. The increasing temperatures will result in unreliable test data. FIG. 1b shows corrosion residue left after testing a device with prior art water based LTI after some LTI came into contact with the chip C4s during electrical test.

Figure 2:
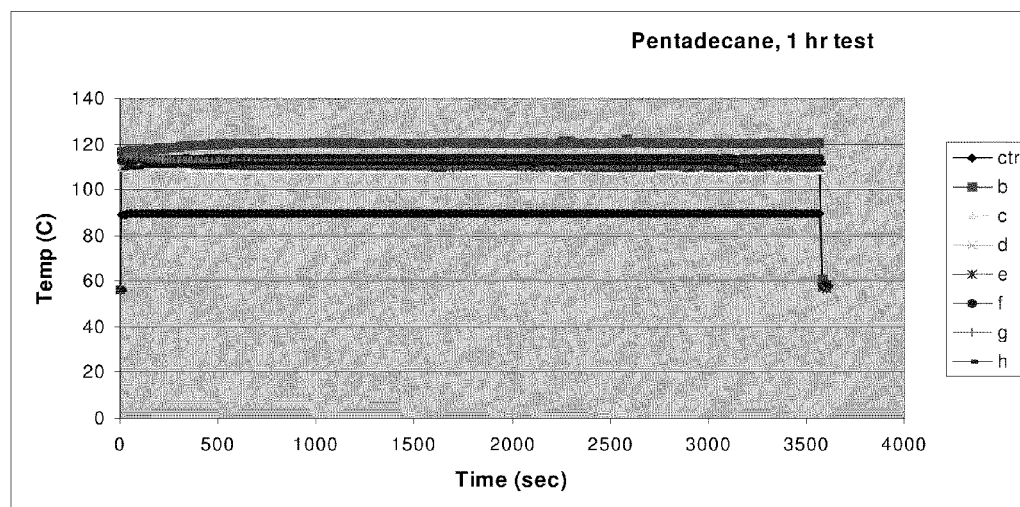
FIG. 2 shows a performance graph of a thermal interface material of the present invention under a temperature test for 1 hour, in accordance with aspects of the invention.

FIG. 2 shows a performance graph of an improved thermal interface material (e.g., Pentadecane) under a temperature test for 1 hour, in accordance with aspects of the invention. It should be understood that similar results (as should be understood with all of the test data herein) would also be provided with other thermal interface materials discussed herein. More specifically, FIG. 2 shows a temperature test for Pentadecane ($C_{15}H_{32}$) as measured at several locations along a device under test. These locations are represented by "ctr" (center) and "b" through "h", which are positions of temperature sensors along a device under test. Surprisingly, this graph shows that Pentadecane was able to withstand temperatures of about 115° C. for about an hour, without evaporating. This is shown by the steady state (e.g., constant) lines in the graphs, compared to the profile of FIG. 1a.

Advantageously and in accordance with the data of FIG. 2, the thermal interface material of the present invention can thus withstand test conditions, e.g., from about 5 to 50 minutes at about 55° C. to about 115° C., without evaporating. More specifically, it has been found that the thermal interface material of the present invention can withstand test conditions for at least 60 minutes and at least 115° C. This eliminates the need to at least (i) disassemble the test structure to replenish the thermal interface material, or (ii) provide an elaborate replenishment system for the test structure, both of which increase test time and costs.

Figure 3:
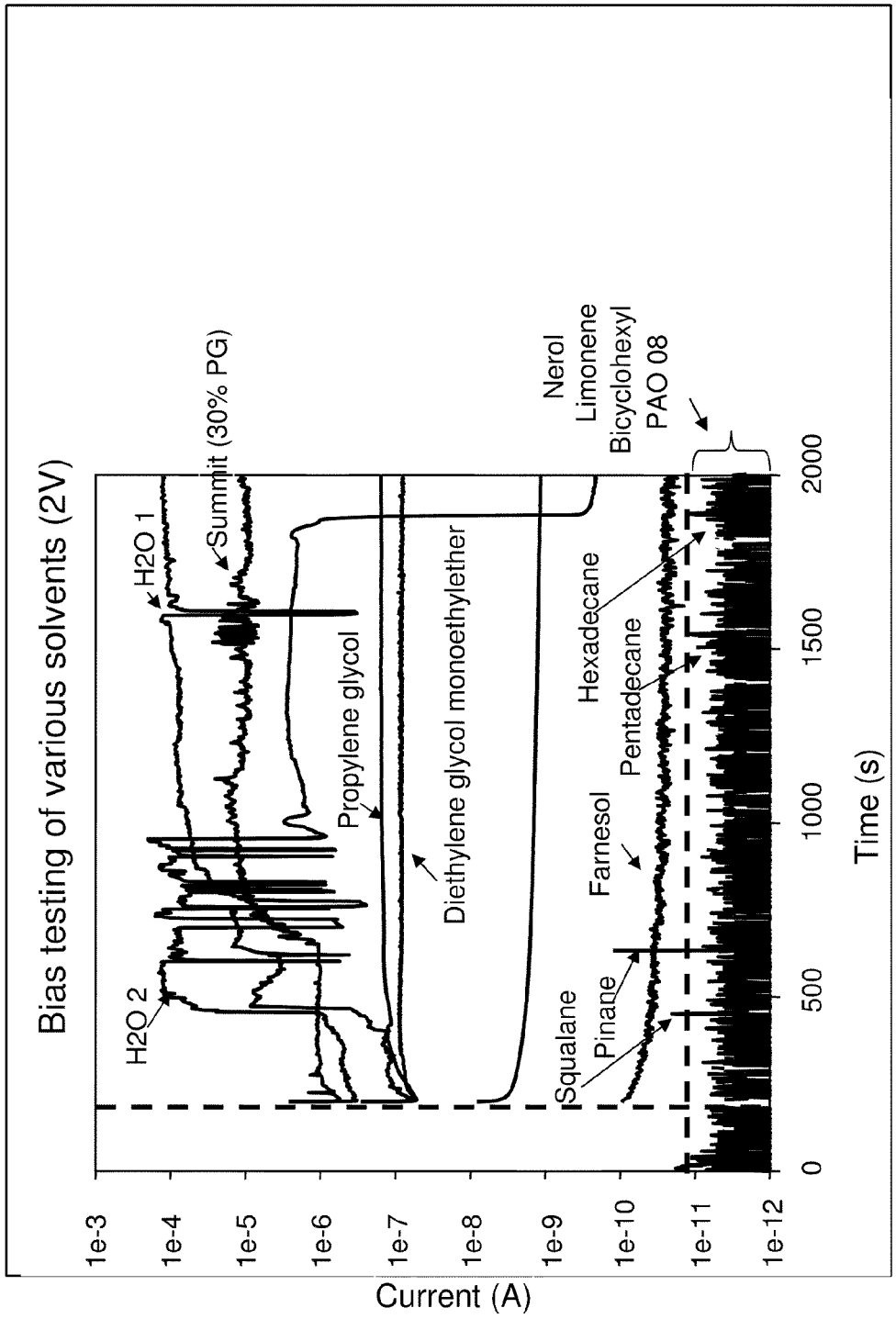
FIG. 3 shows a graph representative of a corrosion test (current vs. time) for various thermal interface materials in accordance with aspect of the invention.

FIG. 3 shows a graph of data for a corrosion test (current vs. time) for various solvents, including Pentadecane ($C_{15}H_{32}$) and Hexadecane ($C_{16}H_{34}$) in accordance with aspects of the invention. This test shows Pentadecane and Hexadecane are non-corrosive materials to the C4, as well as exhibit good electrically insulating properties. It should be understood that similar results would also be provided with other thermal interface materials of the present invention, as discussed herein.

Other materials that exhibit good thermal properties without causing corrosion include, for example, Nerol, Limonene, Pinane and Squalene; however, these materials do not exhibit, in toto, the remaining advantageous properties of the thermal interface materials of the present invention. Namely, these materials may evaporate during the test and/or leave residue on the device under test. For example, as discussed below, Nerol may leave a residue on the device under test, which would require a cleaning with solvent. It has been discovered from this experiment that all materials that had oxygen showed varying amounts of current flow and corrosion. Surprisingly, materials that did not contain oxygen did not allow current flow and had no sign of C4 corrosion.

Figure 4A:
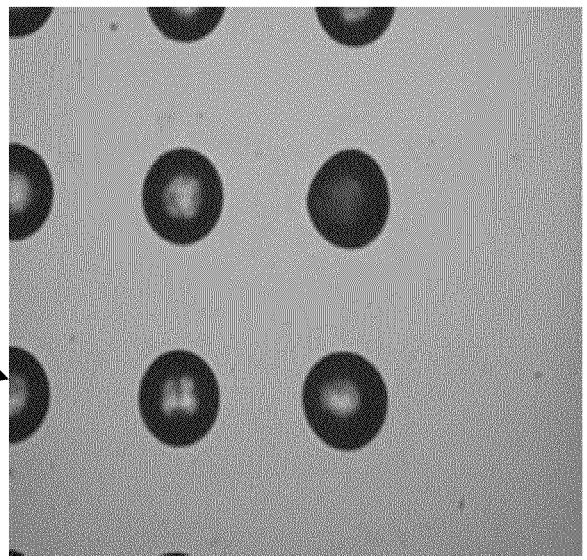
FIGS. 4a and 4b show representative devices that used thermal interface materials of the present invention during testing, in accordance with aspects of the invention.
Figure 4B:
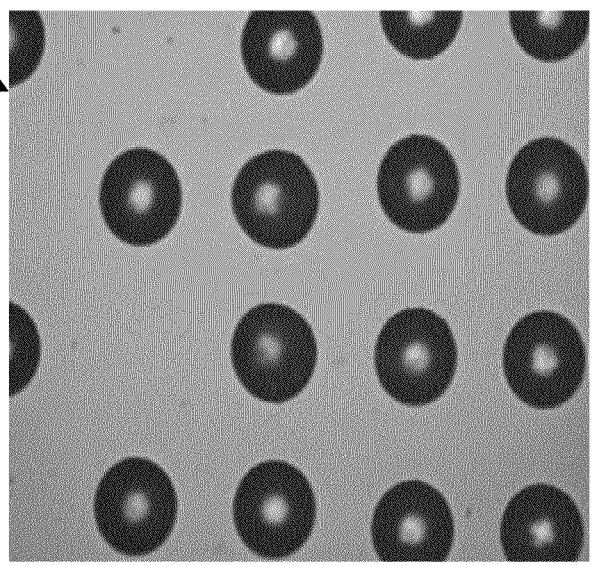

FIGS. 4a and 4b show representative devices that used thermal interface materials of the present invention during testing, in accordance with aspects of the invention. As shown in FIGS. 4a and 4b, devices using a test structure with Pentadecane 15a and Hexadecane 15b, respectively, do not exhibit any residue or corrosion of the chip C4s after testing.

Figure 5:
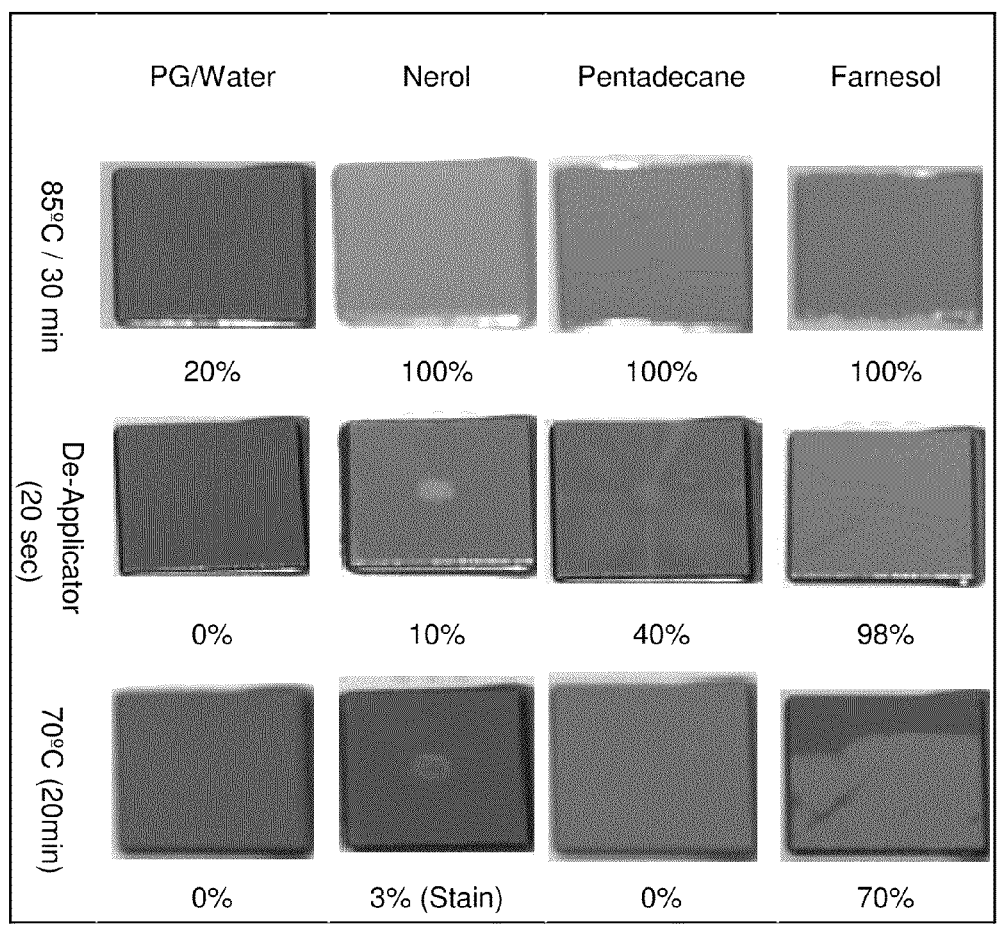
FIG. 5 shows photographs of chip surfaces with several thermal interface materials, including a thermal interface material in accordance with aspects of the invention.

FIG. 5 shows chip surfaces at different phases of testing with different thermal interface materials, including Pentadecane in accordance with aspects of the invention. The testing with the interface material disposed between (in contact with) the chip and heat sink is for 30 min at 85° C. More specifically, FIG. 5 shows data for four thermal interface materials (PG (Propylene Glycol)/water (more specifically, 30% PG+70% De-ionized water), Nerol, Pentadecane and Farnesol). After 30 minutes at 85° C., the heat sink is removed and all chips except PG/Water are 100% covered by the thermal interface materials. The excess thermal interface materials is removed by suction in the deapplicator and then the parts were baked uncovered in an oven for 20 minutes at 70° C. The exposed fluid evaporates much quicker than when it was covered by the heat sink.

Pentadecane shows many advantages over the remaining materials, one of which is no staining after the uncovered baking in an oven for 20 minutes at 70° C. This is in comparison to PG/Water, Nerol and Farnesol, each of which present issues at the same temperature. As should be known by those of skill in the art, Nerol is a monoterpene and Farnesol is a natural organic compound which is an acyclic sesquiterpene alcohol found as a colorless liquid. For example, although FIG. 5 shows that PG/water does not leave any residual, it is known to be corrosive to the C4 structure of the device under test. Also, PG, by itself, poses a risk of having a low flash point and can be a safety hazard, and PG, water or any combination thereof will cause corrosion of the C4s. PG/water is also known to evaporate during long high temperature tests thus requiring constant replenishment. Nerol and Farnesol are non-corrosive to the C4 structure of the device under test, but they both leave residue. For example, as shown by the data of FIG. 5, Nerol leaves a 3% stain; whereas, Farnesol leaves a 70% residue at 70° C.

Figure 6:
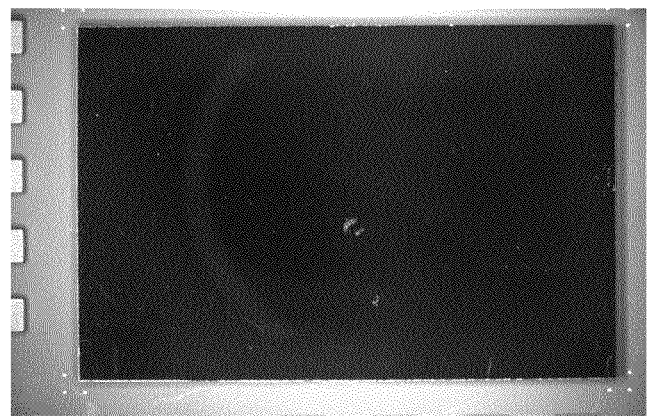
FIG. 6 shows a photograph of a control module and a module processed with Pentadecane.
Figure 6:
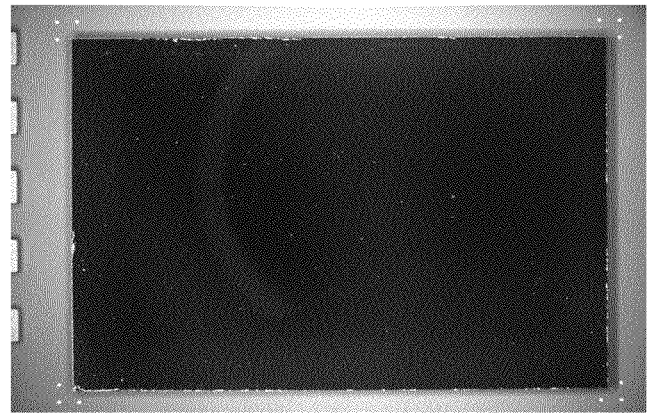

FIG. 6 shows a photograph of a control module and a module processed with Pentadecane. The module processed with the Pentadecane exhibited primarily aliphatic hydrocarbons at levels comparable to the control module. Sodium and potassium were also detected but at reduced levels relative to the control module. In fact, the thermal interface materials of the present invention appear to have helped clean the chip surfaces of both sodium and potassium.

Figure 7:
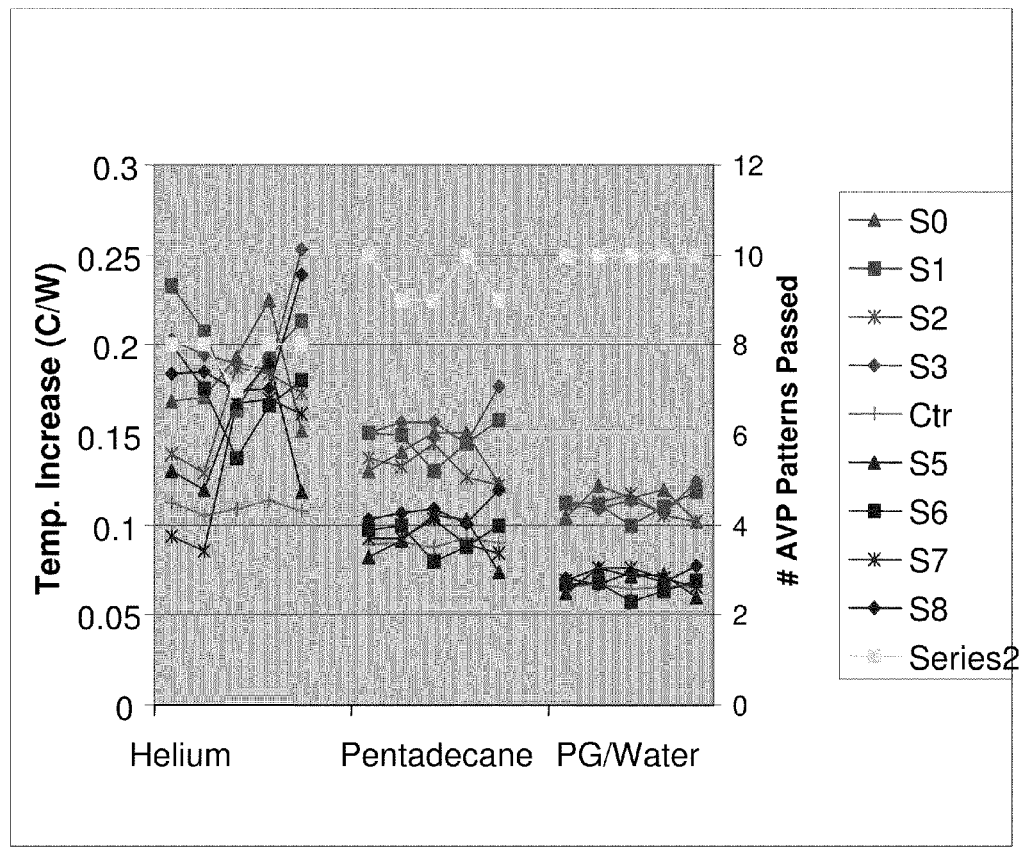
FIG. 7 shows performance data of different thermal interface materials at several different sensor positions along the device.

FIG. 7 shows performance data of different thermal interface materials at several different sensor positions along the device. As shown in the graph, helium provides non-acceptable thermal properties. It is also known that helium needs constant replenishment, as it will dissipate during test. Helium, though, is non-corrosive. Water (e.g., PG/water), on the other hand, is shown to have good thermal properties; however, water is corrosive to the C4 of the device under test and will evaporate during high temperature test conditions and will thus require constant replenishment. In comparison, Pentedecane provides good thermal properties, will not evaporate during test and is not corrosive to the C4 of the device under test.

Figure 8:
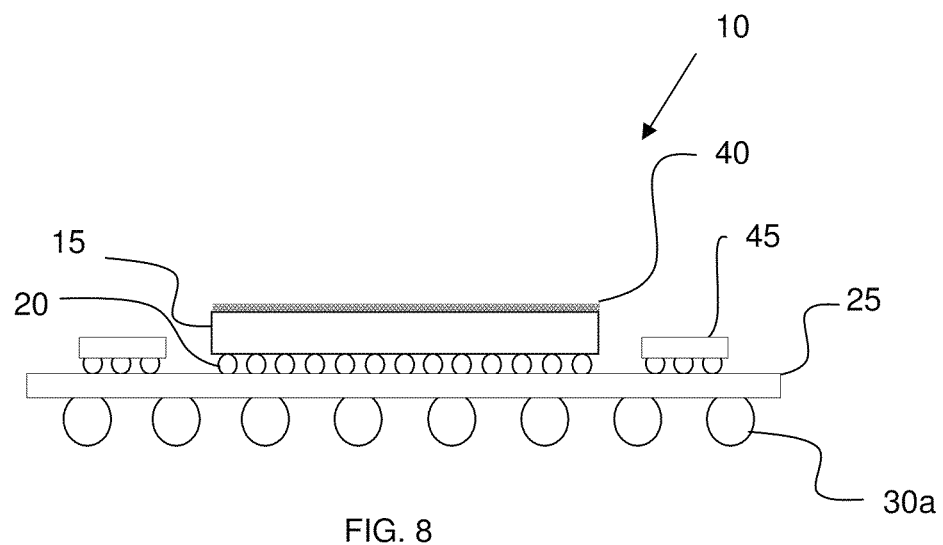
FIG. 8 shows a first structure using the thermal interface materials in accordance with aspects of the invention.

FIG. 8 shows a module using the thermal interface materials in accordance with aspects of the invention. The structure 10 includes a primary electronic component (device) 15 that includes interconnects (e.g., C4s) 20 for bonding to any known type of substrate 25 and/or card. The device 15 can be a single component (e.g., chip) or may be a combination of components (e.g., lidded module). In embodiments, the device 15 may or may not be attached on the substrate 25 and/or card that may or may not have secondary electronic components 45 with or without interconnects 30. The device 15, in embodiments, is to be tested for performance, yield and/or reliability, for example. The substrate 25 and/or card can also include interconnects 30a.

The device 15 is in thermal contact with a heat sink (not shown) using a thermal interface material 40, in order to take away (e.g., dissipate) heat from the powered device. The thermal interface material 40 can be in direct contact with (e.g., disposed between) the device and a heat sink. In embodiments, the thermal interface material 40 can be, for example, a normal alkane such as Pentadecane or Hexadecane. In embodiments, alkanes containing 12 to 16 carbon atoms or a mixture of one or more of these alkanes or other materials of the present invention discussed above. The normal alkane is non-corrosive, thermally stable and has good thermal performance. As discussed above, the thermal interface material 40 does not require cleaning.

The module may also contain an underfill material surrounding the C4 interconnects (not shown) and may be covered with a lid (not shown). In non-limiting embodiments, the device 15 (or chip) can have dimensions 21.3 mm×26.7 mm with C4 interconnects powered up to at least about 340 W. In another illustrative, non-limiting embodiment, the device or chip can have dimensions 23.6 mm×22.0 mm with C4 interconnects powered up to at least about 400 W.

Figure 9A:
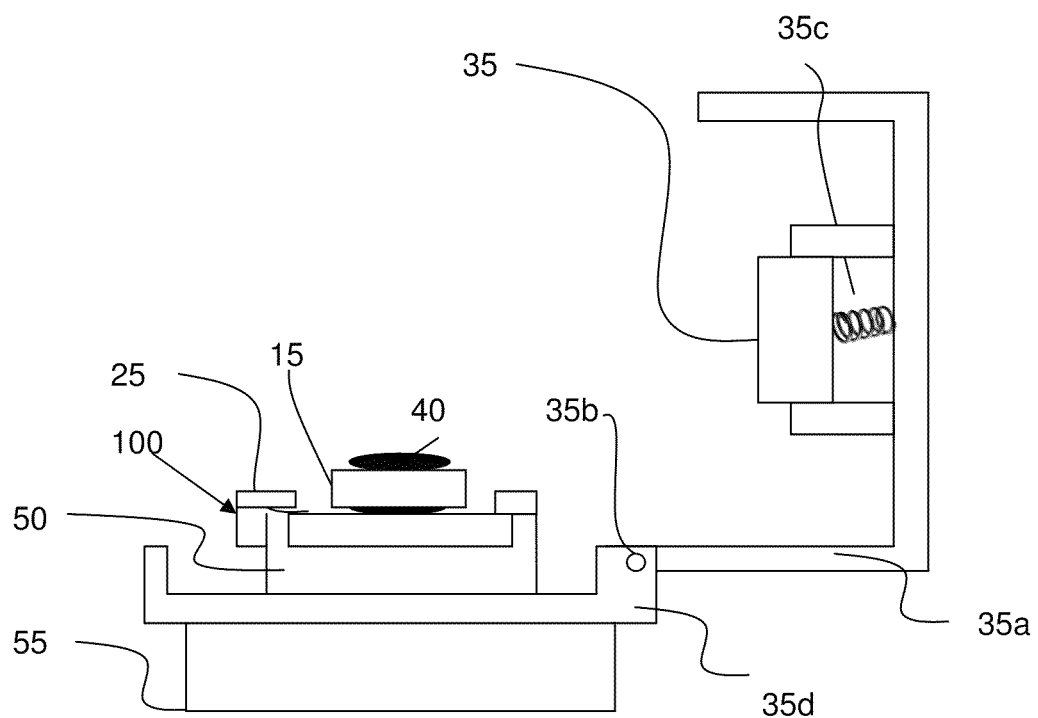
FIG. 9a shows a test socket with a module attached thereto, with a heat sink in non-thermal contact with the device in accordance with aspects of the invention.
Figure 9B:
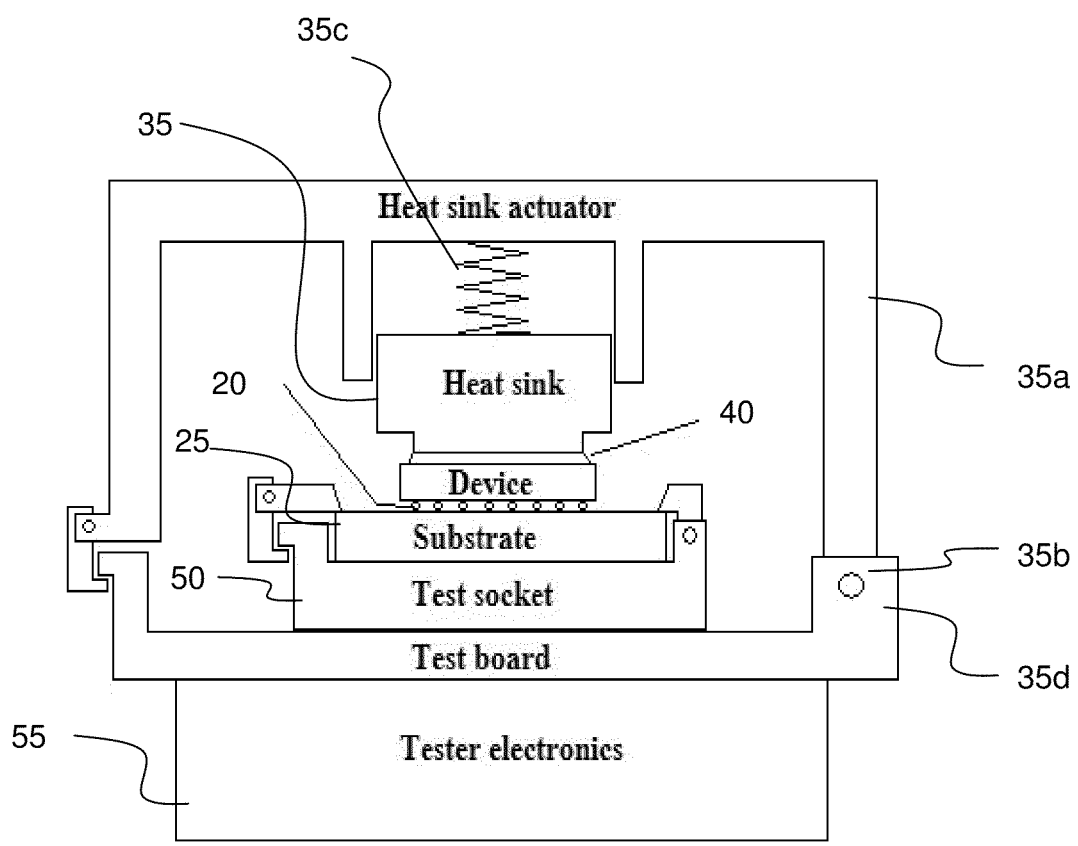
FIG. 9b shows a test socket, where the heat sink is in thermal contact with the module using thermal interface material disposed between the module and heat sink (e.g., after actuating the heat sink into contact with the device)

FIG. 9a shows the module installed in the test socket 50 after applying thermal interface material of the present invention to the surface of the chip. More specifically, FIG. 9a shows a test socket with a module attached thereto, with a heat sink in non-thermal contact with the device. FIG. 9b shows a test socket, where the heat sink is in thermal contact with the module using thermal interface material disposed between the module and heat sink (e.g., after actuating the heat sink into contact with the device). In this latter stage, the thermal interface material of the present invention fills the microscopic gaps between the chip and heat sink 35 thus resulting in improved temperature control.

Referring to both FIGS. 9a and 9b, the socket may include a substrate clamping feature 100 and a hinged (35b) cover (35a) that incorporates a spring (35c) loaded heat sink 35. As shown in FIG. 9a, the module is placed into the socket and thermal interface material placed thereon. The cover 35 can then be closed as shown in FIG. 9b.

In particular, the socket includes a primary electronic component (device) 15 that includes interconnects (e.g., C4s) 20 for bonding to any known type of substrate 25. The device 15 can be attached to a ceramic substrate 25 having capacitors as secondary electronic components also attached to the substrate 25 with leaded and/or non interconnects. The device 15 is in thermal contact with a heat sink 35 by a thermal interface material 40, in order to take away (e.g., dissipate) heat from the powered device. The thermal interface material 40 can be in direct contact with both the device 15 and the heat sink 35. In embodiments, the heat sink 35 may be a water cooled heat-sink with a nickel plated interface to take away heat from the powered device 15. The heat sink 35 may be placed in contact with the device 15 by a heat sink actuator 35a, hinge mounted 35b to a test board 35d with tester electronics 55. The heat sink actuator 35a may include a spring mechanism 35c to provide a downward pressure on the heat sink 35. The heat sink 35 may include flexible supply tubing or bellows to supply cooling fluid (not shown). The heat sink 35 may also include heating elements and temperature sensors to actively control chip temperature. It is understood that FIG. 9b is representative only, there are many other types of sockets, heat sinks and heat sinks actuators well known in the art. It is common that some or all parts of the process is automated.

The thermal interface material 40 can be, for example, a normal alkane such as Pentadecane or Hexadecane. In embodiments, alkanes with 12 to 16 carbon atoms or a mixture of one or more of these alkanes or other materials discussed herein in accordance with the invention. The normal alkane is non corrosive, thermally stable and has good thermal performance. As discussed above, the thermal interface material 40 does not require cleaning and, after test, the device can be placed in an oven at 70° C. for 1 hour to evaporate excess thermal interface material (e.g., Pentadecane).

Figure 10:
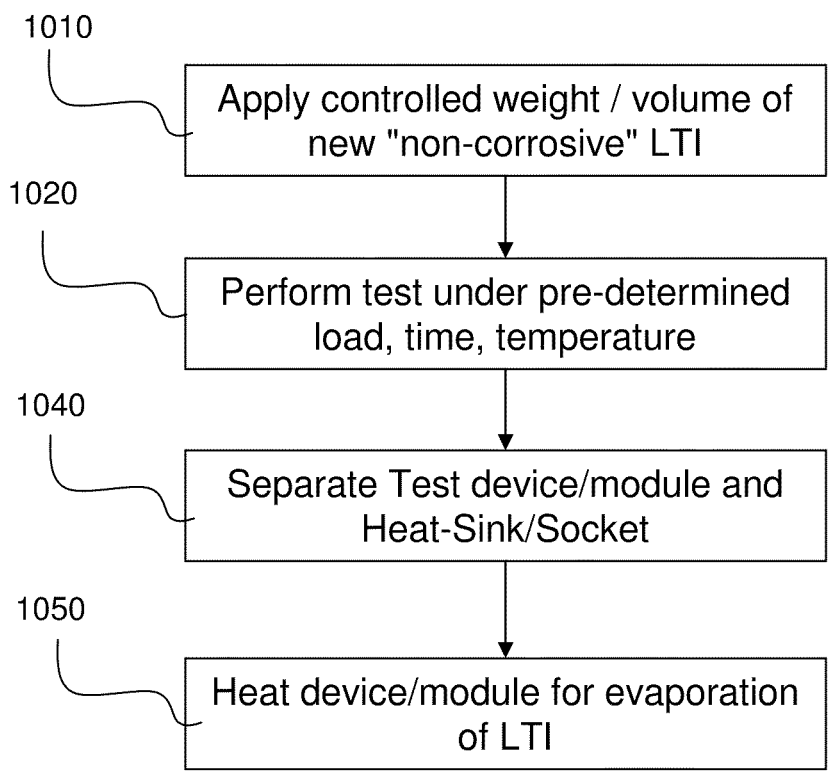
FIG. 10 shows a method of using the thermal interface materials in accordance with aspects of the invention.

FIG. 10 shows a method of implementing the present invention. More specifically, at step 1010, a controlled weight and volume of the thermal interface material of the present invention is applied to device or heat sink. In embodiments, the weight and volume, depends on the tooling attached for the test. The weight or volume for a given device/surface size is calculated or estimated on the chip size, chip and heat sink flatness, chip test temperature and test time. For example, too little weight/volume will not give complete coverage for the entire test; whereas, too much weight/volume will be a waste of material, which may spill out of the active area.

At step 1020, the device is tested for a predetermined load, time and temperature. The load is provided to adequately make contact between the heat sink and device and thermal interface material. In embodiments, the time and temperature may be, for example, 60 minutes at 115° C. It is understood, though, that this is merely one example. At step 1030, the test device/module and heat sink/socket are separated. At step 1040, the device is heated to evaporate the thermal interface material of the present invention.

Table 1, below, shows examples of weights, loads, wattage, test time and test temperature.

TABLE 1

| Example | Chip Size mm × mm | Chip Power Watt | LTI Weight mg | Load lbf | Test Time min | Test Temp ° C. |
|---|---|---|---|---|---|---|
| 1 | 14.7 × 14.7 | 320 | 2.1 | 12.5 | 60 | 115 |
| 2 | 20.9 × 21.7 | 75-350 | 4.0 | 3.5 | 15 | 85 |

The methods as described above is used in the fabrication of integrated circuit chips. The resulting integrated circuit chips can be distributed by the fabricator as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A test structure, comprising:
   a heat sink for dissipating heat away from a device under test; and
   a non-corrosive thermal interface material disposed between the heat sink and the device under test, the non-corrosive thermal interface material being capable of withstanding test conditions for at least 60 minutes for at least 115° C. without staining or leaving residue on the device under test after baking.

2. The test structure of claim 1, wherein the non-corrosive thermal interface material remains intact during the test.

3. The test structure of claim 1, wherein the non-corrosive thermal interface material is compatible with module components and tooling components.

4. The test structure of claim 1, wherein the thermal interface material is an organic thermal interface material that is devoid of fluorine, chlorine, oxygen and nitrogen.

5. The test structure of claim 1, wherein the thermal interface material is an organic thermal interface material that is devoid of oxygen.

6. The test structure of claim 1, wherein the non-corrosive thermal interface material is a hydrocarbon that is devoid of fluorine, chlorine, oxygen and nitrogen.

7. The test structure of claim 1, wherein the non-corrosive thermal interface material is a hydrocarbon that has a boiling point of between about 220° C. to about 300° C.

8. The test structure of claim 1, wherein the non-corrosive thermal interface material is one or more organics with 12 to 16 carbon atoms.

9. The test structure of claim 1, wherein the non-corrosive thermal interface material is one or more normal alkane with 12 to 16 carbon atoms.

10. The test structure of claim 9, wherein the non-corrosive thermal interface material is one or more normal alkane with 14 to 16 atoms.

11. The test structure of claim 10, wherein the non-corrosive thermal interface material is Pentadecane.

12. The test structure of claim 10, wherein the non-corrosive thermal interface material is Hexadecane.

13. A structure of testing a device, comprising:
a substrate or card for attaching to a device under test;
a heat sink structured to dissipate heat away from the device under test; and
a thermal interface material disposed between the heat sink and the device under test, the thermal interface material being non-corrosive to controlled collapse chip connection (C4) components on the device under test, non-evaporative for temperatures of at least 115° C. for about an hour, and residual free after testing is complete.

14. The test structure of claim 13, further comprising a heat sink actuator having a spring mechanism to provide a downward pressure on the heat sink.

15. The test structure of claim 13, wherein the substrate is a ceramic substrate.

16. The test structure of claim 13, wherein the device under test is powered up to at least about 400 W.

17. The test structure of claim 13, wherein the thermal interface material is an organic thermal interface material that is devoid of fluorine, chlorine, oxygen and nitrogen.

18. The test structure of claim 13, wherein the non-corrosive thermal interface material is a hydrocarbon that has a boiling point of between about 220° C. to about 300° C.

19. The test structure of claim 13, wherein the thermal interface material is a normal alkane with 12 to 16 carbon atoms.

20. The test structure of claim 19, wherein the thermal interface material is one of Pentadecane and Hexadecane.

21. A test structure, comprising:
a heat sink for dissipating heat away from a device under test; and
a non-corrosive thermal interface material disposed between the heat sink and the device under test, the non-corrosive thermal interface material being a normal alkane with 12 to 16 carbon atoms, wherein the normal alkane remains intact during testing for at least 60 minutes for at least at 115° C., and does not stain or leave residue on the device under test after baking.

22. The test structure of claim 21, wherein the non-corrosive thermal interface material is one or more normal alkane within a composition containing 12 to 16 carbon atoms.

23. The test structure of claim 21, wherein the thermal interface material is one of Pentadecane and Hexadecane.

24. A method of testing a structure, comprising:
providing a controlled weight and volume of thermal interface material to a device, the thermal interface material being non-corrosive to controlled collapse chip connection (C4) interconnects, is non-evaporative during testing and is residual free;
contacting the device and the thermal interface material with a heat sink;
testing the device under a predetermined load, time and temperature;
separating the device and heat sink; and
heating the device to evaporate the thermal interface material.

* * * * *